(12) United States Patent
Kubo

(10) Patent No.: US 9,852,673 B2
(45) Date of Patent: Dec. 26, 2017

(54) NOISE REMOVAL CIRCUIT

(71) Applicant: ROHM CO., LTD., Ukyo-Ku, Kyoto (JP)

(72) Inventor: Tomoaki Kubo, Kyoto (JP)

(73) Assignee: ROHM CO., LTD., Ukyo-Ku, Kyoto (JP)

( * ) Notice: Subject to any disclaimer, the term of this patent is extended or adjusted under 35 U.S.C. 154(b) by 226 days.

(21) Appl. No.: 14/793,087

(22) Filed: Jul. 7, 2015

(65) Prior Publication Data
US 2016/0005345 A1 Jan. 7, 2016

(30) Foreign Application Priority Data

Jul. 7, 2014 (JP) .................................. 2014-139615

(51) Int. Cl.
G09G 5/00 (2006.01)
G09G 3/20 (2006.01)
H03K 5/1252 (2006.01)

(52) U.S. Cl.
CPC ............. G09G 3/20 (2013.01); G09G 3/2096 (2013.01); H03K 5/1252 (2013.01); G09G 2330/06 (2013.01); G09G 2330/12 (2013.01); G09G 2340/14 (2013.01); G09G 2370/08 (2013.01)

(58) Field of Classification Search
None
See application file for complete search history.

(56) References Cited

U.S. PATENT DOCUMENTS

| 4,686,483 | A | * | 8/1987 | Isshiki | H03K 5/1252 326/21 |
|---|---|---|---|---|---|
| 4,926,072 | A | * | 5/1990 | Hyodo | H03K 5/1252 326/26 |
| 6,008,672 | A | * | 12/1999 | Suto | H03K 5/1252 327/18 |
| 7,817,762 | B2 | * | 10/2010 | Johnstone | H03K 5/084 341/155 |
| 2007/0018932 | A1 | * | 1/2007 | Takaki | G09G 3/3688 345/98 |
| 2009/0002033 | A1 | * | 1/2009 | Nakatani | H03K 5/1252 327/73 |
| 2011/0095815 | A1 | * | 4/2011 | Higuchi | H03K 5/1252 327/551 |

(Continued)

FOREIGN PATENT DOCUMENTS

JP 2013160999 A 8/2013

Primary Examiner — Christopher R Lamb
(74) Attorney, Agent, or Firm — Cantor Colburn LLP

(57) ABSTRACT

When an input signal maintains a first level throughout a predetermined judgment time, a noise removal circuit asserts an output signal. When the input signal transits from the second level to the first level, a first timer starts time measurement. When the input signal transits to the second level after time measurement by the first timer, a second timer measures time during which the input signal continues at the second level. A judgment unit is configured such that (i) it holds the measurement time obtained by the first timer when the input signal transits to the second level, (ii) when the measurement time obtained by the second timer and the measurement time of the first timer thus held satisfy a predetermined relation, the first timer is reset, and (iii) when the measurement time obtained by the first timer exceeds the judgment time, the output signal is asserted.

18 Claims, 8 Drawing Sheets

(56) References Cited

U.S. PATENT DOCUMENTS

2011/0102395 A1* 5/2011 Cheng .................. G09G 3/3614
 345/208
2015/0206492 A1* 7/2015 Lee ...................... G09G 3/3648
 345/208

* cited by examiner

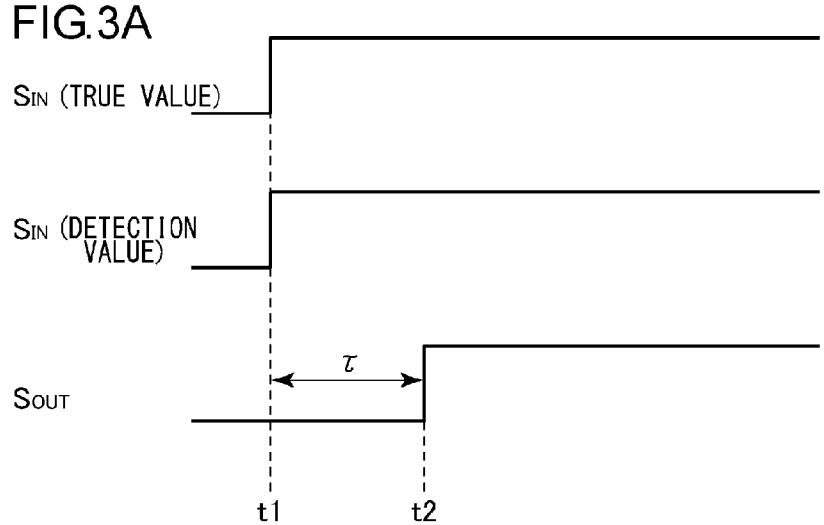
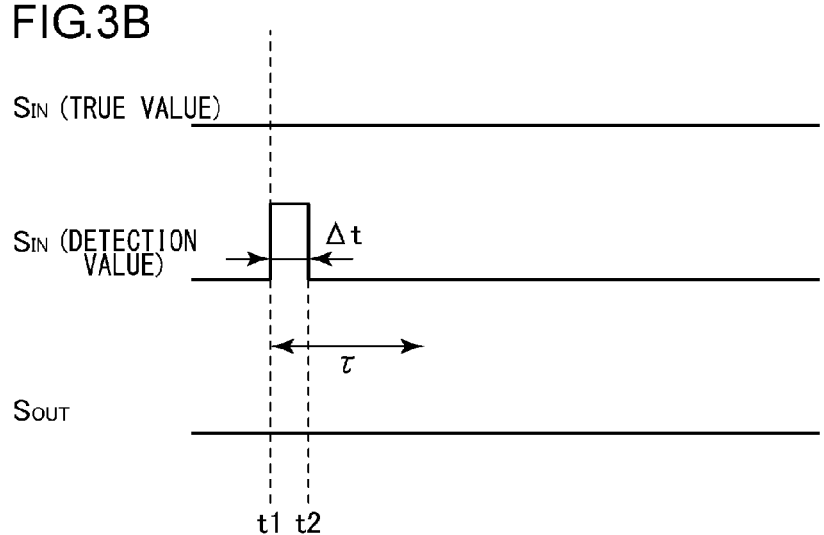
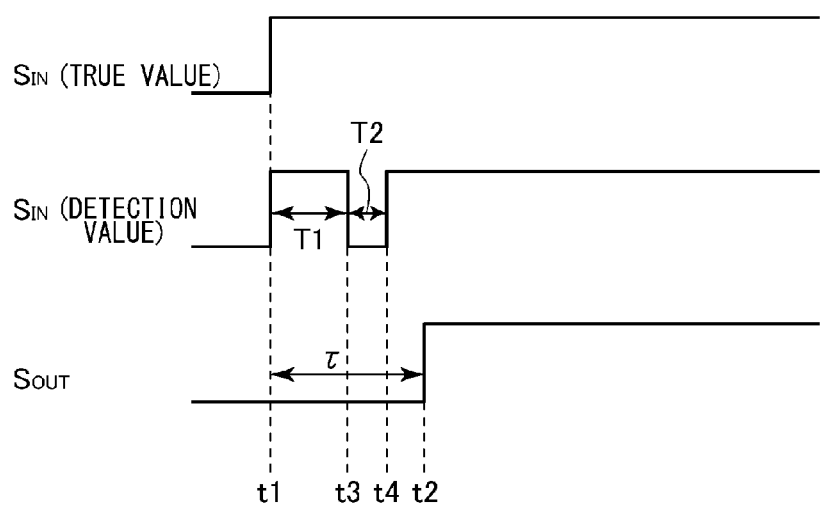

NOISE REMOVAL CIRCUIT

CROSS REFERENCE TO RELATED APPLICATIONS

The present invention claims priority under 35 U.S.C. §119 to Japanese Application No. 2014-139615, filed on Jul. 7, 2014, the entire content of which is incorporated herein by reference.

BACKGROUND OF THE INVENTION

Field of the Invention

The present invention relates to a noise removal circuit.

Description of the Related Art

In order to remove noise from an input signal having two levels that transit in a complementary manner, a noise removal circuit is employed. Such a noise removal circuit is configured as an arrangement in which, when an input signal continues at a predetermined level throughout a predetermined period of time (judgment time), the level of the input signal is determined. Thus, such a noise removal circuit can be regarded as a filter with the judgment time as a time constant.

FIGS. 1A and 1B are operation waveform diagrams each showing the operation of a noise removal circuit. In each diagram, a true value of an input signal $S_{IN}$, an actual input value (detection value) of the input signal $S_{IN}$, and an output signal $S_{OUT}$ are shown.

FIG. 1A shows a basic operation of the noise removal circuit. At a time point t1, the input signal $S_{IN}$ (true value) transits from low level to high level. When there are only negligible noise effects, the true value of the input signal $S_{IN}$ is the same as the detection value. When the detection value of the input signal $S_{IN}$ continues at high level throughout a predetermined judgment time $\tau$, the noise removal circuit switches the output signal $S_{OUT}$ to high level at a time point t2.

FIG. 1B shows a noise removal operation of the noise removal circuit. During a period from a time point t1 up to a time point t2, i.e., during a short period of time $\Delta t$, the detection value of the input signal $S_{IN}$ transits to high level due to noise contamination despite the true value of the input signal $S_{IN}$ being at low level. In this case, the noise continuing time $\Delta t$ is shorter than the judgment time $\tau$. Thus, the output signal $S_{OUT}$ of the noise removal circuit does not transit to high level. As described above, such a filtering function removes the noise effects.

As a result obtained by investigating the noise removal circuit having the aforementioned filtering function, the present inventor has come to recognize the following problem.

FIG. 1C is another operation waveform diagram showing the operation of the noise removal circuit. As with the case shown in FIG. 1A, the true value of the input signal $S_{IN}$ transits to high level at the time point t1, and continues at high level. Thus, in this case, as indicated by the line of alternately long and short dashes, the output signal $S_{OUT}$ should be switched to high level at the time point t2 after the judgment time $\tau$ has elapsed from the time point t1.

However, let us consider a case in which the detection value of the input signal $S_{IN}$ is set to low level due to noise effects during a period from the time point t3 to t4. In this case, such an arrangement having such a filtering function switches the output signal $S_{OUT}$ to high level at the time point t5 after the judgment time $\tau$ has elapsed with the time point t4 as the start point. That is to say, such a noise removal function (filtering function) leads to a delay in determining the output signal $S_{OUT}$ level, which is a problem.

SUMMARY OF THE INVENTION

The present invention has been made in order to solve such a problem. Accordingly, it is an exemplary purpose of an embodiment of the present invention to provide a noise removal circuit which is capable of reducing a delay in signal level determination.

An embodiment of the present invention relates to a noise removal circuit. The noise removal circuit asserts an output signal when an input signal continuously maintains a predetermined first level throughout a predetermined judgment time. The noise removal circuit comprises: a first timer that starts a time measurement operation when the input signal transits to the first level from a second level that is a complementary level of the first level; a second timer that measures a time during which the input signal continues at the second level when the input signal transits to the second level after the first timer starts the time measurement operation; and a judgment unit configured such that (i) the judgment unit holds a measurement time obtained by the first timer when the input signal transits to the second level, (ii) when the relation between a measurement time obtained by the second timer and a measurement time of the first timer thus held satisfies a predetermined relation, the first timer is reset, and (iii) when the measurement time obtained by the first timer exceeds the judgment time, the output signal is asserted.

With such an embodiment, judgment is made whether or not noise has occurred based on the time during which the input signal continues at the second level when the input signal transits to the second level after the input signal transits to the first level. When judgment is made that noise has occurred, a noise removal operation is performed assuming that the input signal continues at the first level. Thus, such an arrangement provides reduced delay time.

In one embodiment, the first timer may comprise a first counter that counts a clock. Also, the second timer may comprise a second counter that counts the clock.

In one embodiment, the judgment unit may comprise memory that latches a count value of the first counter when the input signal transits to the second level.

In one embodiment, the judgment unit may further comprise a comparator unit that generates the output signal based on a count value held by the memory and a count value of the second counter.

In one embodiment, when the count value of the second counter exceeds the count value held by the memory, the comparator unit may reset the first counter.

In one embodiment, the comparator unit may reset the first counter based on a difference between the count value of the second counter and the count value held by the memory.

Another embodiment of the present invention also relates to a noise removal circuit. The noise removal circuit comprises: a first counter that starts a count operation when the input signal transits to the first level from a second level that is a complementary level of the first level; a second counter that performs time counting during a time in which the input signal continues at the second level when the input signal transits to the second level after the first counter starts the count operation; and a judgment unit configured such that (i) the judgment unit holds the count value of the first counter when the input signal transits to the second level, (ii) when the count value of the second counter exceeds the count value of the first counter thus held, the judgment unit resets the first counter, and (iii) when the count value of the first counter exceeds a predetermined threshold value, the output signal is asserted.

With such an embodiment, judgment is made whether or not noise has occurred based on the time during which the input signal continues at the second level when the input signal transits to the second level after the input signal transits to the first level. When judgment is made that noise has occurred, a noise removal operation is performed assuming that the input signal continues at the first level. Thus, such an arrangement provides reduced delay time.

In one embodiment, the judgment unit may generate a noise detection signal which is asserted when the input signal transits to the second level after the output signal is asserted.

In one embodiment, the noise removal circuit may monolithically be integrated on a single semiconductor substrate.

Examples of such a "monolithically integrated" arrangement include: an arrangement in which all the circuit components are formed on a semiconductor substrate; and an arrangement in which principal circuit components are monolithically integrated. Also, a part of the circuit components such as resistors and capacitors may be arranged in the form of components external to such a semiconductor substrate in order to adjust the circuit constants.

By monolithically integrating the circuit on a single chip, such an arrangement allows the circuit area to be reduced, and allows the circuit elements to have uniform characteristics.

Yet another embodiment of the present invention relates to a timing controller that receives image data including pixel data and a data enable signal, and that controls a source driver and a gate driver. The timing controller comprises any one of the aforementioned noise removal circuits. Also, the data enable signal may be input to the noise removal circuit.

In one embodiment, the timing controller may further comprise: a receiver that receives the image data; line memory that holds pixel data included in the image data received by the receiver; a noise detector that generates a noise detection signal which is asserted when noise is detected; a memory controller that suspends updating of the line memory during a predetermined period after the noise detection signal is asserted; and a transmitter that outputs the pixel data stored in the line memory to the source driver.

Yet another embodiment of the present invention relates to a timing controller that receives image data including pixel data. The timing controller comprises: a receiver that receives the image data; line memory that holds pixel data included in the image data received by the receiver; a noise detector that generates a noise detection signal which is asserted when noise is detected; a memory controller that suspends updating of the line memory during a predetermined period after the noise detection signal is asserted; and a transmitter that outputs the pixel data stored in the line memory to the source driver.

With such an embodiment, when noise is detected in a transfer operation for transferring the pixel data for a given line, the luminance level to be set for the display panel is not updated for the pixels after the noise has been detected. Thus, such an arrangement suppresses the occurrence of disturbance in the image.

In one embodiment, the predetermined period may be set to a period required to complete an operation for each line.

In addition to the pixel data, the image data may further include a data enable signal which is asserted during a period in which effective pixel data is transmitted. The noise detector may detect the presence or absence of noise based on the data enable signal.

In one embodiment, the noise detector may assert the noise detection signal when the data enable signal is negated in a period in which the data enable signal is to continuously remain asserted after the data enable signal is asserted.

Yet another embodiment of the present invention relates to an electronic device. The electronic device comprises: a display panel comprising a gate driver as a built-in component; a source driver; and the aforementioned timing controller that controls the source driver.

Yet another embodiment of the present invention relates to a display apparatus. The display apparatus comprises: a display panel comprising a gate driver as a built-in component; a source driver; and the aforementioned timing controller that controls the source driver.

It should be noted that any combination of the aforementioned components or any manifestation of the present invention may be mutually substituted between a method, apparatus, and so forth, which are effective as an embodiment of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIGS. 3A through 3C are operation waveform diagrams each showing the operation of the noise removal circuit shown in FIG. 2;

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B.

Similarly, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

First Embodiment

Figure 2:
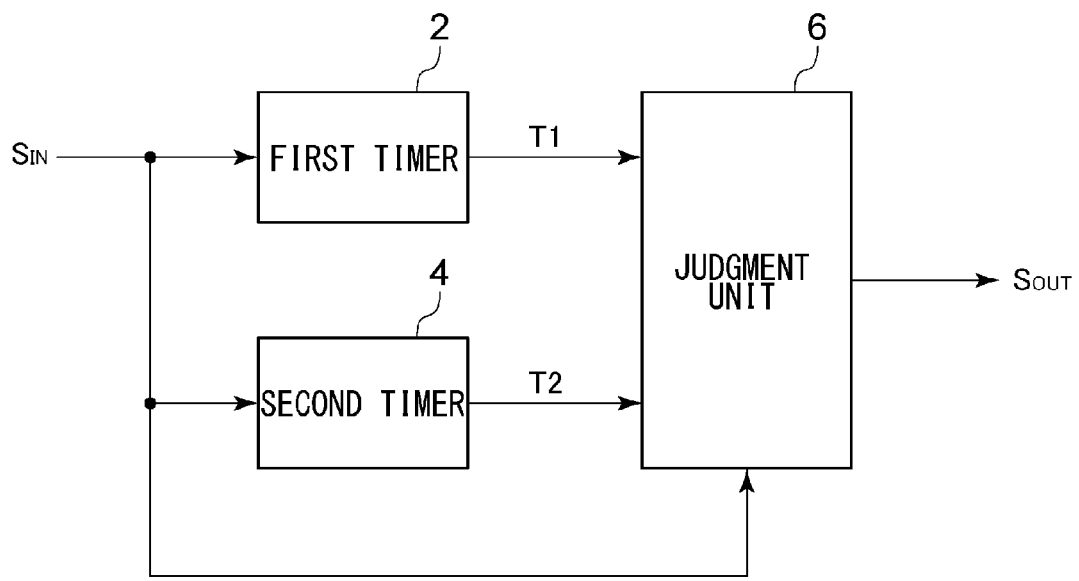
FIG. 2 is a block diagram showing a noise removal circuit according to a first embodiment.

FIG. 2 is a block diagram showing a noise removal circuit 1 according to a first embodiment. The noise removal circuit 1 receives a binary input signal $S_{IN}$ that can be set to either a first level (high level in the present embodiment) or a second level (low level in the present embodiment). The noise removal circuit has a noise removal function in which, when the input signal $S_{IN}$ maintains the first level (high level) throughout a predetermined judgment time τ, the output signal $S_{OUT}$ is asserted (set to high level in the present embodiment).

The noise removal circuit 1 includes a first timer 2, a second timer 4, and a judgment unit 6. When the input signal $S_{IN}$ transits from the second level (low level) to the first level (high level), the first timer 2 starts a time measurement operation.

When the input signal $S_{IN}$ transits to the second level (low level) after the first timer 2 starts the time measurement operation, the second timer 4 measures the time during which the input signal $S_{IN}$ continues at the second level.

The judgment unit 6 is configured (i) to hold the measurement time T1 acquired by the first timer 2 when the input signal $S_{IN}$ transits to the second level, and (ii) to reset the first timer 2 when the measurement time T2 acquired by the second timer 4 and the measurement time T1' thus held satisfy a predetermined relation. Examples of such a predetermined relation will be listed below.

(i) The measurement time T2 acquired by the second timer 4 matches the measurement time T1' of the first timer 2 thus held.

(ii) The measurement time T2 acquired by the second timer 4 is greater than the measurement time T1' of the first timer 2 thus held.

(iii) The difference between the measurement time T2 acquired by the second timer 4 and the measurement time T1' of the first timer 2 thus held matches a predetermined value.

(iv) The ratio (T2/T1') of the measurement time T2 acquired by the second timer 4 with respect to the measurement time T1' of the first timer 2 thus held is equal to or greater than a predetermined value.

For simplicity of description and ease of understanding, description will be made regarding an arrangement in which, when the measurement time T2 acquired by the second timer 4 matches the measurement time T1' of the first timer 2 thus held, the first timer 2 is reset.

Furthermore, the judgment unit 6 is configured (iii) to assert the output signal $S_{OUT}$ when the measurement time T1 acquired by the first timer 2 exceeds the judgment time τ.

The above is the basic configuration of the noise removal circuit 1. Next, description will be made regarding the operation thereof.

Figure 1A:
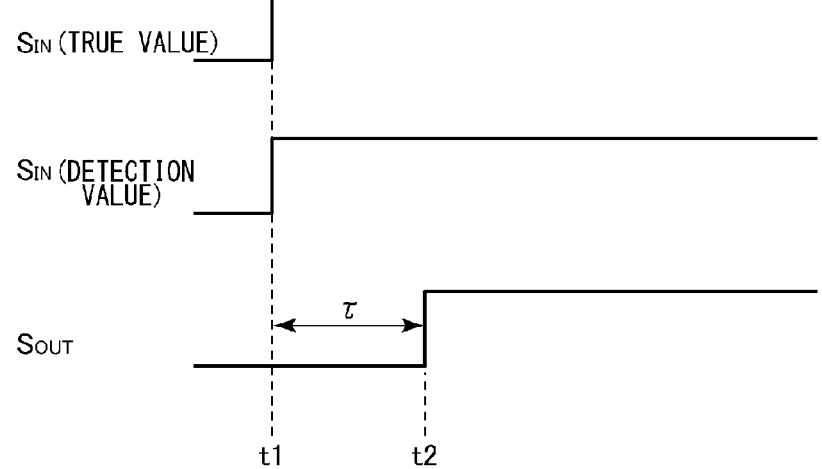
FIGS. 1A through 1C are operation waveform diagrams each showing the operation of a noise removal circuit according to a comparison technique.
Figure 1B:
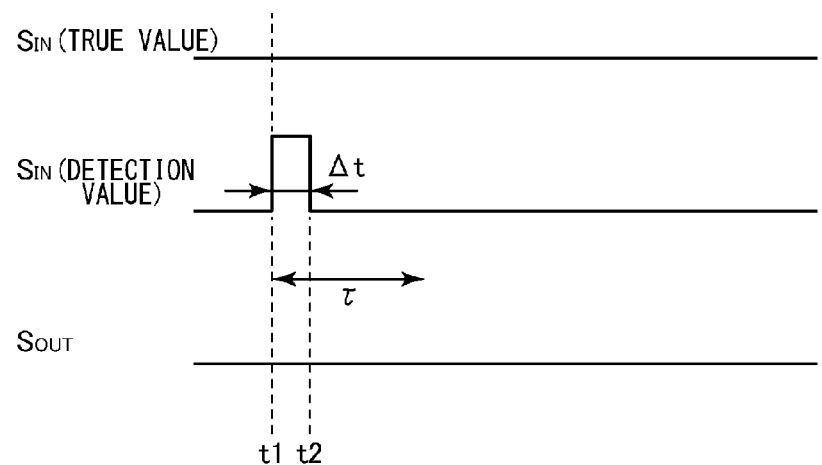

FIGS. 3A through 3C are operation waveform diagrams each showing the operation of the noise removal circuit 1 shown in FIG. 2. The operations shown in FIGS. 3A and 3B are the same as those shown in FIGS. 1A and 1B. Thus, it can be clearly understood that the noise removal function operates effectively.

Description will be made with reference to FIG. 3C. At the time point t1, the true value of the input signal $S_{IN}$ transits to high level. According to this transition, the detection value of the input signal $S_{IN}$ also transits to high level. The first timer 2 measures the time T1 during which the detection value is set to high level. At the time point t3, the detection value of the input signal $S_{IN}$ transits to low level. In this stage, the second timer 4 measures the time T2 during which the detection value is set to low level. The judgment unit 6 makes a comparison between the time T1 and the time T2. In this case, T1 is greater than T2. Thus, judgment is made that the low level period T2 has occurred due to noise effects. In this case, the first timer 2 is not reset. That is to say, the first timer 2 continues the time measurement operation. At the time point t2 after the judgment time τ elapses from the time point t1, the output signal $S_{OUT}$ is asserted.

Figure 1C:
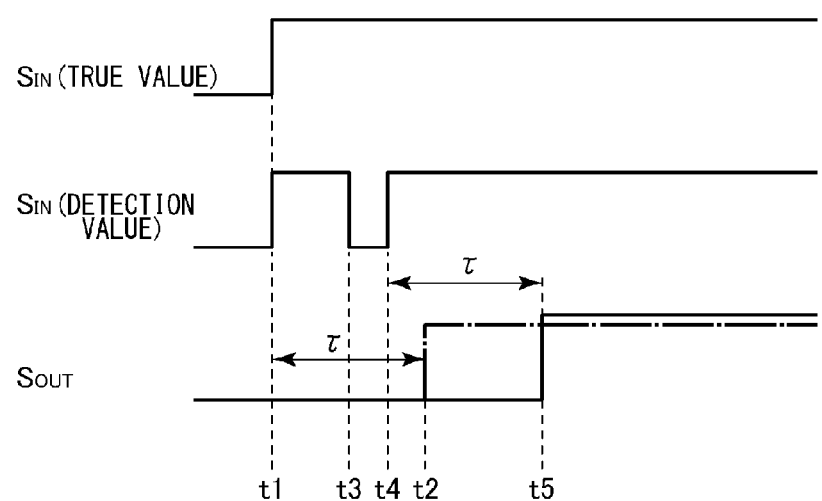

As described above, with the noise removal circuit 1, such an arrangement is capable of removing noise effects, thereby allowing the output signal $S_{OUT}$ to be generated based on the true value of the input signal $S_{IN}$. As can be clearly understood from the comparison with the operation shown in FIG. 1C, with the noise removal circuit 1 shown in FIG. 2, such an arrangement is capable of reducing delay time.

The present invention is regarded as a configuration shown in the block diagram in FIG. 2, and may include various kinds of circuits configured to operate according to the waveform diagrams shown in FIGS. 3A through 3C. Specific description will be made regarding an example of such circuits.

Figure 4:
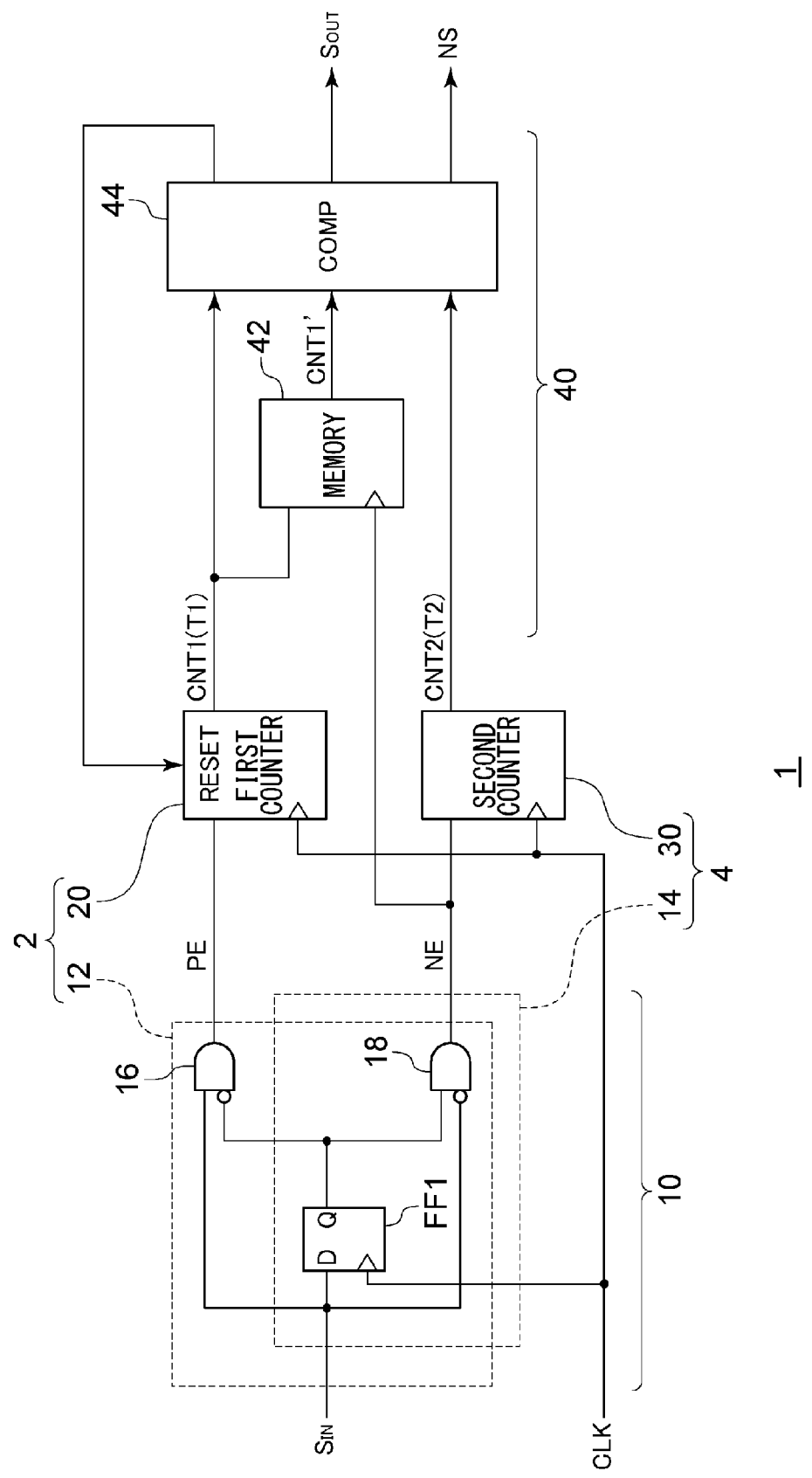
FIG. 4 is a circuit diagram showing an specific example configuration of the noise removal circuit.

FIG. 4 is a circuit diagram showing a specific example configuration of the noise removal circuit 1.

The noise removal circuit 1 includes an edge detection unit 10, a first counter 20, a second counter 30, and a judgment unit 40. The noise removal circuit 1 is mounted on a function IC (Integrated Circuit) monolithically integrated on a single semiconductor substrate. Also, the noise removal circuit 1 may receive a signal from another IC.

The edge detection unit 10 includes a positive edge detection unit 12 and a negative edge detection unit 14. The positive edge detection unit 12 detects a positive edge of the input signal $S_{IN}$, i.e., a transition from the first level (low level) to the second level (high level). The positive edge detection unit 12 includes a flip-flop FF1 and an AND gate 16. The flip-flop FF1 latches the input signal $S_{IN}$ for every positive edge of the clock signal CLK. The output Q of the flip-flop FF1 is set to the input signal $S_{IN}$ of the immediately previous cycle. The AND gate 16 outputs the logical AND of the input signal $S_{IN}$ and the inverted signal of the output Q of the flip-flop FF1.

The negative edge detection unit 14 detects a negative edge of the input signal $S_{IN}$, i.e., a transition from the second level (high level) to the first level (low level). The negative edge detection unit 14 includes a flip-flop FF1 and an AND gate 18. The flip-flop FF1 is shared between the negative edge detection unit 14 and the positive edge detection unit 12. The AND gate 18 outputs the logical AND of the inverted signal of the input signal $S_{IN}$ and the output Q of the flip-flop FF1.

The first counter 20 receives a positive edge detection signal PE output from the positive edge detection unit 12 and a clock signal CLK. When the positive edge detection signal PE is asserted (set to high level), i.e., when the first signal $S_{IN}$ transits from the second level (low level) to the first level (high level), the first counter 20 performs a count operation in synchronization with the clock CLK (which will be referred to as the "count-up operation" hereafter).

The positive edge detection unit 12 and the first counter 20 correspond to the first timer 2 shown in FIG. 2. Also, the count value of the first counter 20 (which will be referred to as the "first count value CNT1") corresponds to the measurement time T1 measured by the first timer 2.

The second counter 30 receives a negative edge detection signal NE output from the negative edge detection unit 14 and the clock signal CLK. When the negative edge detection signal NE is asserted (set to high level), i.e., when the input signal $S_{IN}$ transits from the first level (high level) to the second level (low level), the second counter 30 performs a count operation in synchronization with the clock CLK (which will be referred to as the "count-up operation" hereafter).

The negative edge detection unit 14 and the second counter 30 correspond to the second timer 4 shown in FIG. 2. Also, the count value (which will be referred to as the "second count value CNT2") of the second counter 30 corresponds to the measurement time T2 measured by the second timer 4.

Memory 42 and a comparator unit 44 correspond to the judgment unit 40 shown in FIG. 2.

The memory 42 receives the negative edge detection signal NE from the negative edge detection unit 14. When the negative edge detection signal NE is asserted, i.e., when the input signal $S_{IN}$ transits to the second level (low level), the memory 42 latches the count value CNT1 of the first counter 20 at this timing.

The comparator unit 44 generates the output signal $S_{OUT}$ based on the count value CNT1 of the first counter 20, the count value CNT2 of the second counter 30, and the count value CNT1' held by the memory 42.

When the count value CNT1 of the first counter 20 exceeds a threshold value TH that corresponds to the judgment time τ, the comparator unit 44 asserts the output signal $S_{OUT}$. Furthermore, when the count value CNT2 of the second counter 30 is equal to, or when it is greater than, the count value CNT1' held by the memory 42, the comparator unit 44 asserts a reset signal RST so as to reset the count value CNT1 of the first counter 20 to zero. For example, the comparator unit 44 may reset the first counter 20 based on the difference between the count value CNT2 of the second counter 30 and the count value CNT1' held by the memory 42.

For example, when the difference becomes zero, i.e., when the count value CNT1' matches the count value CNT2, the comparator unit 44 may reset the first counter 20. Alternatively, when the difference becomes a predetermined value other than zero, i.e., when the difference between the count values CNT1' and CNT2 becomes a predetermined value, the comparator unit 44 may reset the first counter 20.

The judgment unit 40 may be configured to be capable of generating a noise detection signal NS in addition to the output signal $S_{OUT}$. When the input signal $S_{IN}$ transits to the second level (low level) even though the input signal $S_{IN}$ is to be set to the first level (high level) after the output signal $S_{OUT}$ is asserted, the comparator unit 44 may assert the noise detection signal NS.

Figure 5:
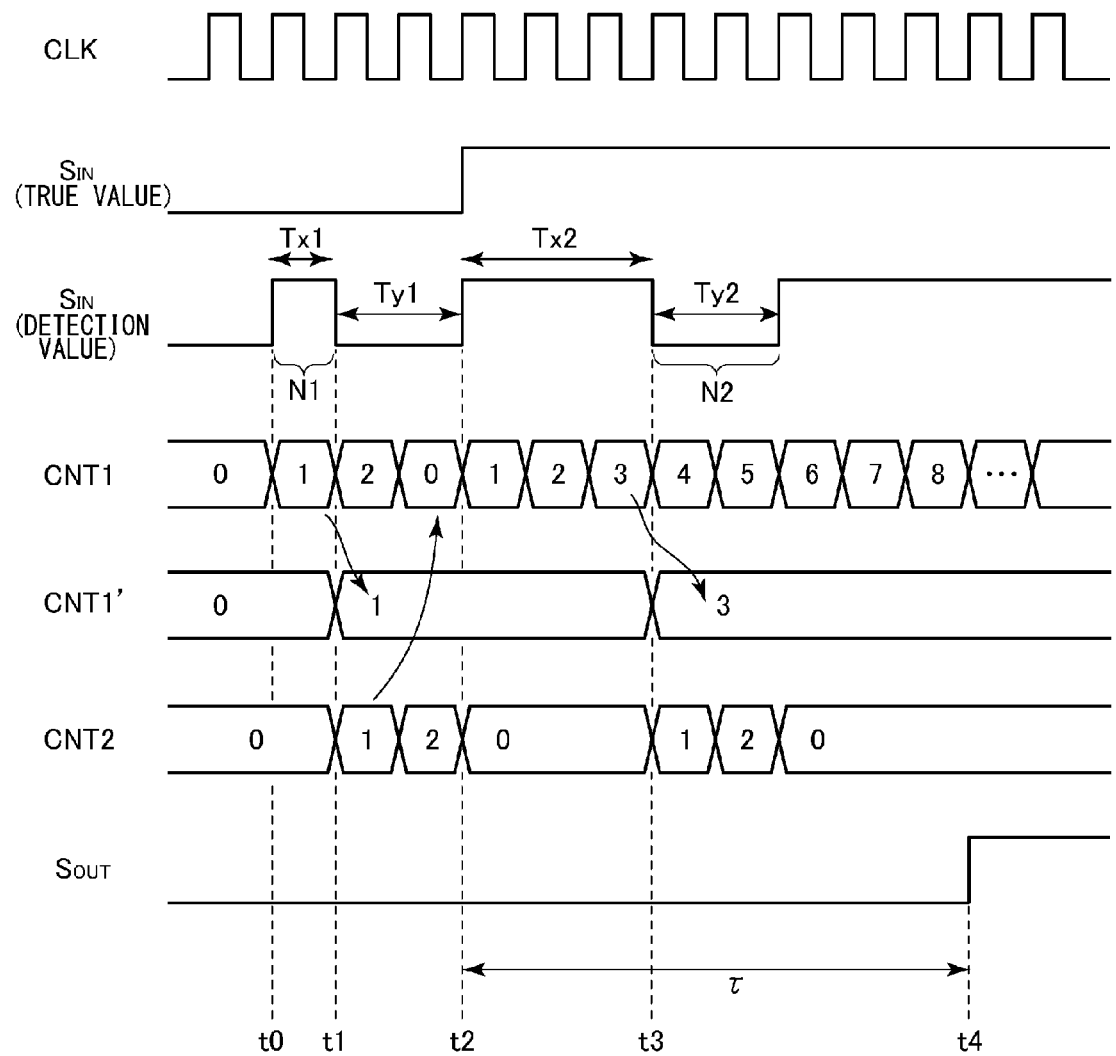
FIG. 5 is an operation waveform diagram showing the operation of the noise removal circuit shown in FIG. 4.

The above is a specific example configuration of the noise removal circuit 1. Next, description will be made regarding the operation thereof. FIG. 5 is an operation waveform diagram showing the operation of the noise removal circuit 1 shown in FIG. 4.

The true value of the input signal $S_{IN}$ is set to low level before the time point t2, and is set to high level after the time point t2.

When the detection value of the input signal $S_{IN}$ transits to high level due to noise N1 at the time point t0, the first counter 20 counts up. When the detection value of the input signal $S_{IN}$ transits to low level at the time point t1, the count value CNT1 of the first counter 20 is held by the memory 42.

During a period in which the detection value of the input signal $S_{IN}$ is set to low level, the second counter 30 counts up. When the count value CNT2 matches the count value CNT1', the comparator unit 44 resets the first counter 20. That is to say, in this case, the relation Tx1<Ty1 holds true, and accordingly, judgment is made that the high level period Tx1 has occurred due to noise.

When the detection value of the input signal $S_{IN}$ transits to high level at the time point t2, the first counter 20 counts up again. When the detection value of the input signal $S_{IN}$ transits to low level due to the noise N2 at the time point t3, the count value CNT1=3, which is obtained by the first counter 20, is held by the memory 42 at that timing.

During a period in which the detection value of the input signal $S_{IN}$ is set to low level, the second counter 30 counts up. In this case, the relation Tx2>Ty2 holds true, and accordingly, the count value CNT2 does not reach the count value CNT1' thus held. In this case, the first counter 20 is not reset, and continues to count up. Subsequently, when the count value CNT1 of the first counter 20 reaches the threshold value TH=8 at the time point t4, the comparator unit 44 asserts the output signal $S_{OUT}$.

The above is the operation of the noise removal circuit 1 shown in FIG. 4.

The noise removal circuit 1 shown in FIG. 4 is configured as a digital circuit. Also, such a noise removal circuit 1 may be configured as an analog circuit. For example, the first timer 2 and the second timer 4 may each be configured as an analog timer including a capacitor that is charged and discharged using a constant current. The judgment unit 6 may be configured as a comparator that compares the capacitor voltage with a reference voltage. Also, the timer reset function may correspond to a function of resetting the charge (voltage) stored in the capacitor to an initial level.

Alternatively, the noise removal circuit 1 may be configured as a combination of an analog circuit and a digital circuit.

The usage of the noise removal circuit 1 is not restricted in particular. Rather, such a noise removal circuit 1 is applicable to various kinds of circuits. Description will be made regarding a timing controller 200 configured as such an application example.

Figure 6:
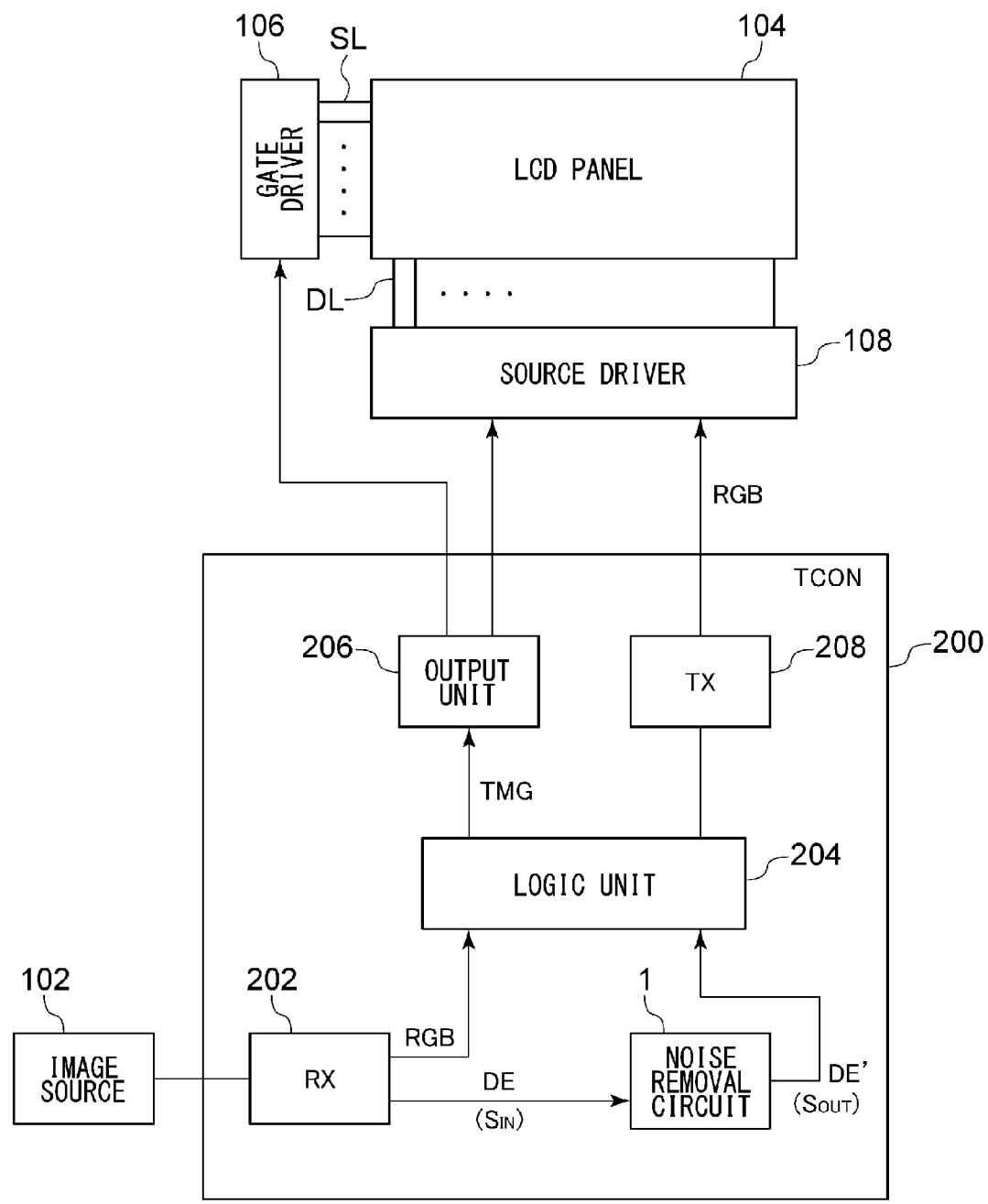
FIG. 6 is a block diagram showing a timing controller including a noise removal circuit.

FIG. 6 is a block diagram showing the timing controller 200 including the noise removal circuit 1. The timing controller 200 is mounted on a display apparatus 100 together with an LCD (Liquid Crystal Display) panel 104, a gate driver 106, and a source driver 108.

The LCD panel 104 includes multiple data lines DL, multiple scanning lines SL arranged orthogonally to the data lines DL, and multiple TFTs (Thin Film Transistors) arranged in the form of a matrix, at the points of intersection of the multiple data lines DL and the multiple scanning lines SL. The source driver 108 applies a voltage to each of the multiple data lines DL according to the luminance. The gate driver 106 sequentially selects the multiple scanning lines SL.

The display apparatus 100 is connected to an image source 102 such as a graphics processor of a personal computer, a tuner unit of a TV receiver, or the like, via a digital interface configured according to the HDMI (Trademark) standard, DVI standard, DisplayPort standard, or the like. With such an arrangement, the image data to be displayed on the LCD panel 104 is transmitted from the image source 102 to the display apparatus 100 by means of two-line serial transmission using a clock line and a data line.

The timing controller 200 of the display apparatus 100 receives, from the image source 102, the image data to be displayed on the LCD panel 104. The timing controller 200 generates a driver control signal (which is generally referred to as a "timing signal TMG") according to the resolution of the LCD panel 104. The timing controller 200 supplies the driver control signal thus generated to the gate driver 106 and the source driver 108 together with the image data.

First, description will be made regarding a common configuration of the timing controllers 200a and 200b. The timing controller 200 includes a receiver 202, the noise removal circuit 1, a logic unit 204, an output unit 206, and a transmitter 208.

The receiver 202 receives the image data from the image source 102. The image data includes pixel data RGB, a pixel clock CLK, and a data enable signal DE. The pixel data RGB is input to the logic unit 204. The noise removal circuit 1 removes noise that occurs in the data enable signal DE received by the receiver 202, and outputs the data enable signal DE thus subjected to noise removal to the logic unit 204. That is to say, the input signal $S_{IN}$ shown in FIG. 2 corresponds to the data enable signal DE. Also, the output signal $S_{OUT}$ corresponds to the data enable signal DE' after noise removal.

The logic unit 204 performs necessary signal processing on the pixel data RGB. The transmitter 208 is connected to the source driver 108 via a bus configured according to the RSDS (Reduced Swing Differential Signaling) standard, the LVDS (Low Voltage Differential Signaling) standard, or the like. The transmitter 208 sequentially outputs the pixel data RGB.

Furthermore, the logic unit 204 generates various kinds of driver control signals TMG. The output unit 206 outputs the driver control signals TMG to the gate driver 106 and the source driver 108.

For example, the logic unit 204 generates a reference signal REF which is asserted at a predetermined timing for each frame. Furthermore, the logic unit 204 asserts the multiple driver control signals at a predetermined timing for a predetermined period in synchronization with the reference signal REF. In some cases, there is a difference between manufacturers in the name or symbol that indicates each driver control signal, which can clearly be understood by those skilled in this art.

With such a timing controller 200, after the true value of the data enable signal DE transits to a predetermined level, the data enable signal DE continues at this predetermined level for at least a predetermined period. The noise removal circuit 1 is suitably employed to remove noise from such a data enable signal DE.

Second Embodiment

Figure 7:
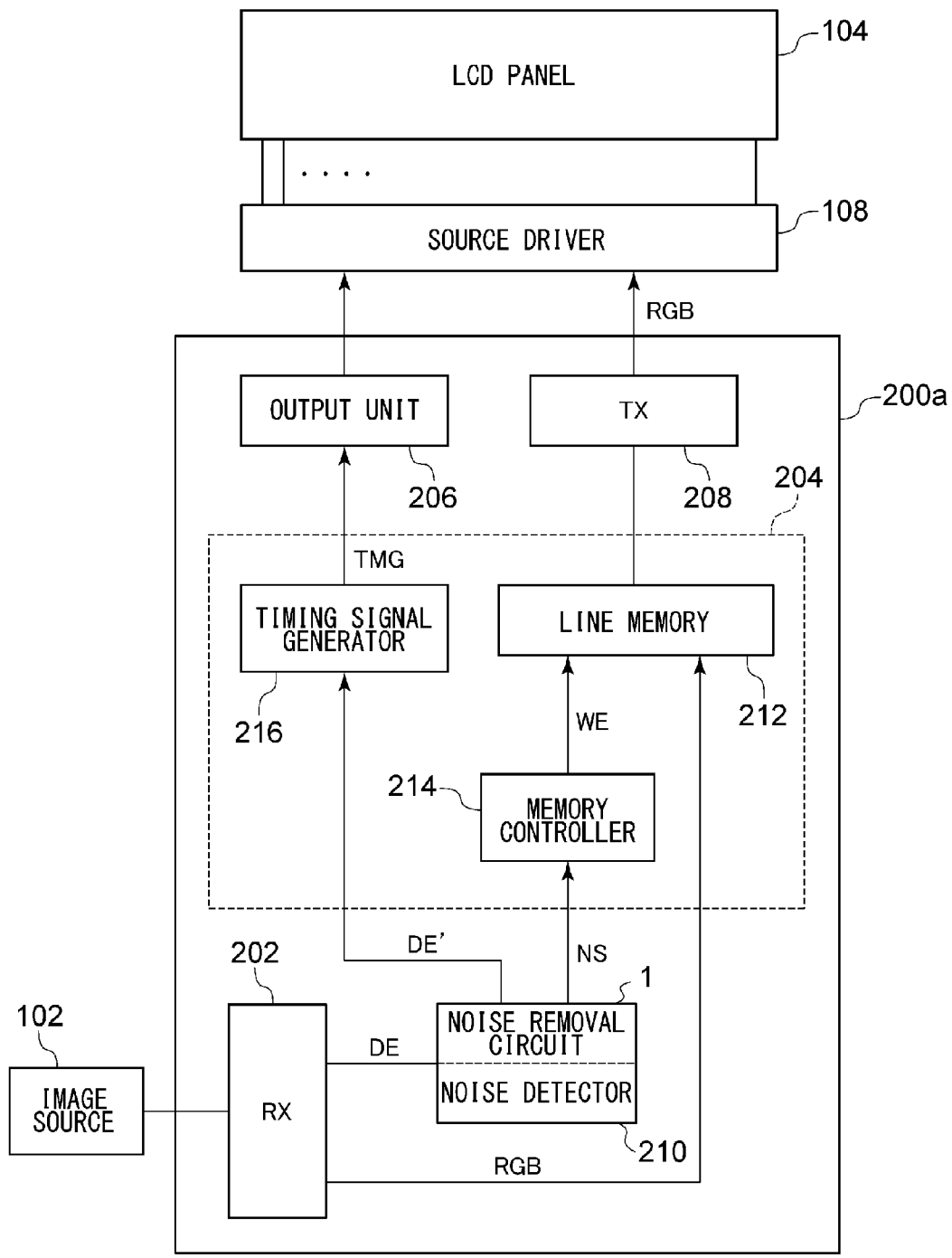
FIG. 7 is a block diagram showing a display apparatus including a timing controller according to a second embodiment.

FIG. 7 is a block diagram showing a display apparatus 100a including the timing controller 200a according to a second embodiment.

A display apparatus 100a shown in FIG. 7 has the same configuration as that of the display apparatus 100 shown in FIG. 6 except that, in the display apparatus 100a, the gate driver 106 is built into the LCD panel 104.

The timing controller 200a further includes a noise detector 210 in addition to the components of the timing controller 200 shown in FIG. 6.

The noise detector 210 judges the presence or absence of noise based on the data received by the receiver 202. When the noise detector 210 detects noise, the noise detector 210 asserts (e.g., sets to high level) a noise detection signal NS.

For example, the noise detector 210 may judge the presence of absence of noise based on the data enable signal DE received by the receiver 202. As described above, the data enable signal DE repeats a cycle in which, after the data enable signal DE transits to a predetermined level, it continues at this level throughout a predetermined time, following which it transits to the original level. That is to say, the transition pattern of the data enable signal DE is known. Thus, when the transition of the data enable signal DE deviates from such a predetermined pattern (expected pattern), the noise detector 210 may assert the noise detection signal DE. More specifically, when the data enable signal DE is negated in a period in which it is to remain asserted after it has been asserted, the noise detector 210 may assert the noise detection signal NS.

As the noise detection signal NS, the signal generated by the comparator unit 44 shown in FIG. 4 may be used.

The logic unit 204 includes line memory 212, a memory controller 214, and a timing signal generator 216.

The line memory 212 holds the pixel data received by the receiver 202. When the noise detection signal NS is asserted, the memory controller 214 negates (e.g., sets to low level) a write enable signal WE, which suspends the updating of the line memory 212 for a predetermined period from this time point.

Such a predetermined period may be set to a time required for the completion of reception for each line. Also, when the noise detection signal NS is asserted, the memory controller 214 may suspend the updating of the line memory 212 for a predetermined number of pixels from this time point. Also, when the noise detection signal NS is asserted, the memory controller 214 may suspend the updating of the line memory 212 until a predetermined mask time elapses from this time point.

The transmitter 208 outputs the pixel data stored in the line memory 212 to the source driver 108. The timing signal generator 216 generates various kinds of timing control signals (driver control signals) TMG in synchronization with the data enable signal DE.

Figure 8:
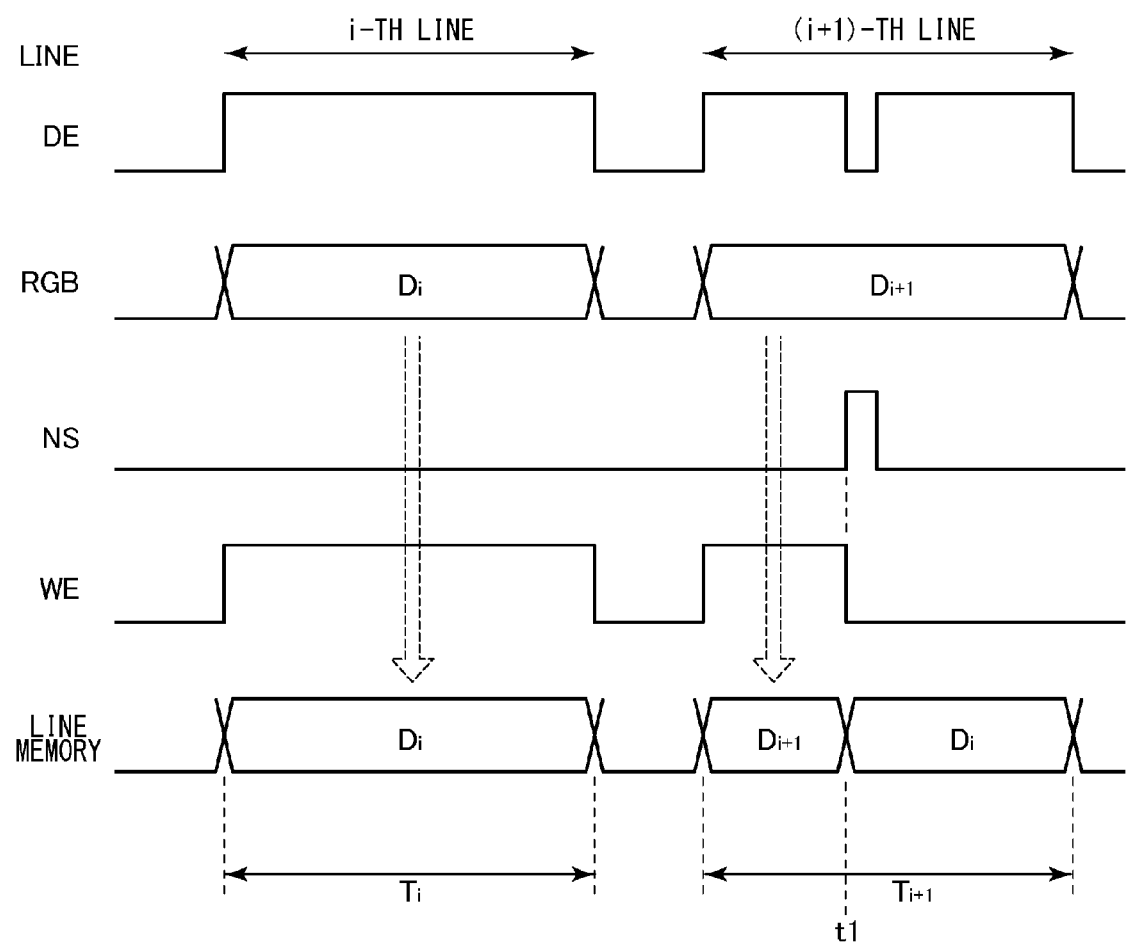
FIG. 8 is an operation waveform diagram showing the operation of the timing controller shown in FIG. 7.

The above is the configuration of the display apparatus 100a. Next, description will be made regarding the operation thereof. FIG. 8 is an operation waveform diagram showing the operation of the timing controller 200a shown in FIG. 7.

During the period $T_i$ in which the data enable signal DE is asserted, the receiver 202 receives the pixel data $D_i$ for the i-th line. Noise is not detected throughout the period $T_i$. Thus, the write enable signal WE is asserted during this period. In this state, the pixel data $D_i$ thus received is sequentially written to the line memory 212.

In the next period in which the data enable signal DE is asserted, the receiver 202 receives the pixel data $D_{i+1}$ for the (i+1)-th line. When noise is detected in the data enable signal DE at a time point t1 in the period $T_{i+1}$, the noise detection signal NS is asserted. Before the noise detection signal NS is asserted, the write enable signal WE is asserted. In this state, the (i+1)-th line pixel data is sequentially written to the line memory 212. When the noise detection signal NS is asserted at the time point t1, the write enable signal WE is negated. In this state, the updating of the line memory 212 is suspended. That is to say, during a period in which the write enable signal WE is negated, the line memory 212 continues to store the pixel data $D_i$ for the i-th line, i.e., the immediately previous line.

The above is the operation of the display apparatus 100*a*.

When noise occurs in the pixel data transfer operation for a given line, in many cases, transmission error occurs in the pixel data due to the noise. In this case, there is a high probability of the occurrence of disturbance in the image. Directing attention to a pixel that forms the image data, in many cases, the luminance of this pixel is close to the luminance of the pixels in the vicinity of this pixel. Alternatively, in many cases, the luminance of this pixel is close to that of the same pixel in the immediately previous frame. Thus, when noise is detected, the updating of the line memory 212 is suspended. In this state, instead of the pixel data received after the noise is detected, the pixel data received as the immediately previous line, which can be assumed to have been received normally, is used, thereby suppressing the occurrence of disturbance in the image.

Description has been made regarding the present invention with reference to the embodiments. The above-described embodiments have been described for exemplary purposes only, and are by no means intended to be interpreted restrictively. Rather, various modifications may be made for each component, each process, and various kinds of combinations of these. Description will be made regarding such modifications.

Lastly, description will be made regarding the usage of the display apparatus 100.

The display apparatus 100 may be mounted on a TV receiver. Also, the display apparatus 100 may be configured as a monitor externally connected to a computer. Also, such a display apparatus 100 may be mounted on an electronic device such as a laptop computer, tablet terminal, cellular phone terminal, car navigation system, or the like. That is to say, the application of the display apparatus 100 is not restricted in particular.

While the preferred embodiments of the present invention have been described using specific terms, such description is for illustrative purposes only, and it is to be understood that changes and variations may be made without departing from the spirit or scope of the appended claims.

What is claimed is:

1. A noise removal circuit that asserts an output signal when an input signal continuously maintains a predetermined first level throughout a predetermined judgment time, the noise removal circuit comprising:
   a first timer that starts a time measurement operation when the input signal transits to the first level from a second level that is a complementary level of the first level;
   a second timer that measures a time during which the input signal continues at the second level when the input signal transits to the second level after the first timer starts the time measurement operation; and
   a judgment unit configured such that (i) the judgment unit holds the measurement time obtained by the first timer when the input signal transits to the second level, (ii) when the relation between a measurement time obtained by the second timer and the measurement time of the first timer thus held satisfies a predetermined relation, the first timer is reset, and (iii) when the measurement time obtained by the first timer exceeds the judgment time, the output signal is asserted.

2. The noise removal circuit according to claim 1, wherein the first timer comprises a first counter that counts a clock, and wherein the second timer comprises a second counter that counts the clock.

3. The noise removal circuit according to claim 2, wherein the judgment unit comprises memory that latches a count value of the first counter when the input signal transits to the second level.

4. The noise removal circuit according to claim 3, wherein the judgment unit further comprises a comparator unit that generates the output signal based on a count value held by the memory and a count value of the second counter.

5. The noise removal circuit according to claim 4, wherein, when the count value of the second counter exceeds the count value held by the memory, the comparator unit resets the first counter.

6. The noise removal circuit according to claim 4, wherein the comparator unit resets the first counter based on a difference between the count value of the second counter and the count value held by the memory.

7. The noise removal circuit according to claim 4, wherein the comparator unit resets the first counter based on a ratio between the count value of the second counter and the count value held by the memory.

8. The noise removal circuit according to claim 1, wherein the judgment unit generates a noise detection signal which is asserted when the input signal transits to the second level after the output signal is asserted.

9. The noise removal circuit according to claim 1, monolithically integrated on a single semiconductor substrate.

10. A timing controller that receives image data including pixel data and a data enable signal, and that controls a source driver and a gate driver, the timing controller comprising the noise removal circuit according to claim 1, wherein the data enable signal is input to the noise removal circuit.

11. The timing controller according to claim 10, further comprising:
    a receiver that receives the image data;
    line memory that holds pixel data included in the image data received by the receiver;
    a noise detector that generates a noise detection signal which is asserted when noise is detected;
    a memory controller that suspends updating of the line memory during a predetermined period after the noise detection signal is asserted; and
    a transmitter that outputs the pixel data stored in the line memory to the source driver.

12. The timing controller according to claim 11, wherein the predetermined period is set to a period required to complete an operation for each line.

13. The timing controller according to claim 11, wherein the noise detector judges the presence or absence of noise based on the data enable signal.

14. The timing controller according to claim 13, wherein the noise detector asserts the noise detection signal when the data enable signal is negated in a period in which the data enable signal is to continuously remain asserted after the data enable signal is asserted.

15. A display apparatus comprising:
    a display panel comprising a gate driver as a built-in component;
    a source driver; and
    the timing controller according to claim 10, that controls the source driver.

16. An electronic device comprising:
    a display panel comprising a gate driver as a built-in component;
    a source driver; and
    the timing controller according to claim 10, that controls the source driver.

17. A noise removal circuit that asserts an output signal when an input signal continuously maintains a predetermined first level throughout a predetermined judgment time, the noise removal circuit comprising:
- a first counter that starts a count operation when the input signal transits to the first level from a second level that is a complementary level of the first level;
- a second counter that performs time counting during a time in which the input signal continues at the second level when the input signal transits to the second level after the first counter starts the count operation; and
- a judgment unit configured such that (i) the judgment unit holds the count value of the first counter when the input signal transits to the second level, (ii) the judgment unit resets the first counter based on a comparison result between the count value of the second counter and the count value of the first counter thus held, and (iii) when the count value of the first counter exceeds a predetermined threshold value, the output signal is asserted.

18. A method for detecting whether or not an input signal continuously maintains a predetermined first level throughout a predetermined judgment time, the method comprising:
- starting a count operation by a first counter when the input signal transits to the first level from a second level that is a complementary level of the first level;
- performing time counting by a second counter during a time in which the input signal continues at the second level when the input signal transits to the second level after the first counter starts the count operation;
- holding the count value of the first counter when the input signal transits to the second level;
- resetting the first counter when the count value of the second counter exceeds the count value of the first counter; and
- asserting an output signal when the count value of the first counter exceeds a predetermined threshold value.

* * * * *